United States Patent
Fukui et al.

(10) Patent No.: US 9,319,645 B2
(45) Date of Patent: *Apr. 19, 2016

(54) ENCODING METHOD, DECODING METHOD, ENCODING DEVICE, DECODING DEVICE, AND RECORDING MEDIUM FOR A PLURALITY OF SAMPLES

(75) Inventors: Masahiro Fukui, Tokyo (JP); Shigeaki Sasaki, Tokyo (JP); Yusuke Hiwasaki, Tokyo (JP); Shoichi Koyama, Tokyo (JP); Kimitaka Tsutsumi, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 625 days.

This patent is subject to a terminal disclaimer.

(21) Appl. No.: 13/807,156

(22) PCT Filed: Jul. 4, 2011

(86) PCT No.: PCT/JP2011/065275
§ 371 (c)(1),
(2), (4) Date: Dec. 27, 2012

(87) PCT Pub. No.: WO2012/005211
PCT Pub. Date: Jan. 12, 2012

(65) Prior Publication Data
US 2013/0101049 A1    Apr. 25, 2013

(30) Foreign Application Priority Data
Jul. 5, 2010    (JP) .................................. 2010-152970

(51) Int. Cl.
*H04N 7/28*    (2006.01)
*H04N 19/60*    (2014.01)
(Continued)

(52) U.S. Cl.
CPC ................ *H04N 7/28* (2013.01); *G10L 19/038* (2013.01); *H03M 7/3082* (2013.01); *H04N 19/126* (2014.11); *H04N 19/94* (2014.11)

(58) Field of Classification Search
CPC ...... G01L 19/038; H04N 7/28; H04N 19/126; H03M 7/3082
USPC ...................................................... 375/240.22
See application file for complete search history.

(56) References Cited

U.S. PATENT DOCUMENTS 5,309,232 A    5/1994    Hartung et al.
5,684,920 A    11/1997    Iwakami et al.
(Continued)

FOREIGN PATENT DOCUMENTS

EP    1 024 477 A1    8/2000
JP    6 46403    2/1994
(Continued)

OTHER PUBLICATIONS

Extended European Search Report issued Jul. 31, 2014 in Patent Application No. 11803545.0.
(Continued)

*Primary Examiner* — Jay Patel
*Assistant Examiner* — Francis G Geroleo
(74) *Attorney, Agent, or Firm* — Oblon, McClelland, Maier & Neustadt, L.L.P.

(57) ABSTRACT

In encoding, index information indicating a group of coefficients that minimizes the sum of the error between the value of each sample and the value is obtained by multiplying the quantized value of each of a plurality of samples by a coefficient corresponding to the position of the sample. The coefficient is selected from a plurality of groups of predetermined coefficients corresponding to the positions of the samples. In decoding, a plurality of values corresponding to an input vector quantization index are obtained as decoded values corresponding to a plurality of sample positions. With the use of a group of predetermined coefficients corresponding to the plurality of sample positions and indicated by input index information, the values obtained by multiplying the decoded values and the coefficients, corresponding to the sample positions are output.

12 Claims, 6 Drawing Sheets

(51) Int. Cl.
*G10L 19/038* (2013.01)
*H03M 7/30* (2006.01)
*H04N 19/126* (2014.01)
*H04N 19/94* (2014.01)

(56) References Cited

U.S. PATENT DOCUMENTS

| | | | |
|---|---|---|---|
| 5,864,798 A * | 1/1999 | Miseki et al. | 704/225 |
| 6,334,105 B1 | 12/2001 | Ehara | |
| 6,968,092 B1 * | 11/2005 | Winger | 382/253 |
| 7,680,669 B2 * | 3/2010 | Ozawa | 704/500 |
| 7,788,105 B2 * | 8/2010 | Miseki | 704/500 |
| 8,260,621 B2 * | 9/2012 | Miseki | 704/500 |
| 8,315,861 B2 * | 11/2012 | Miseki | 704/223 |
| 2004/0117178 A1 * | 6/2004 | Ozawa | 704/230 |
| 2005/0060147 A1 * | 3/2005 | Norimatsu et al. | 704/230 |
| 2005/0261893 A1 * | 11/2005 | Toyama et al. | 704/201 |
| 2006/0089836 A1 * | 4/2006 | Boillot et al. | 704/500 |
| 2011/0044405 A1 * | 2/2011 | Sasaki et al. | 375/296 |
| 2011/0099018 A1 * | 4/2011 | Neuendorf et al. | 704/500 |
| 2012/0146831 A1 * | 6/2012 | Eksler | 341/200 |

FOREIGN PATENT DOCUMENTS

| | | |
|---|---|---|
| JP | 7 261800 | 10/1995 |
| JP | 8 44399 | 2/1996 |
| WO | 2009 093714 | 7/2009 |

OTHER PUBLICATIONS

Jonas Svedberg, et al., "High level description of the Ericsson/Motorola/TI EV coder candidate", L.M. Ericsson, Motorola UK Ltd, and Texas Instruments Inc., International Telecommunications Union, Telecommunication Standardization Sector, ITU-T WP3/16, Document AC-0703-Q9-04, XP017543353, Mar. 2007, pp. 1-4.

Per Hedelin, "Single stage spectral quantization at 20 bits", Proceedings of the International Conference on Acoustics, Speech, and Signal Processing (ICASSP), vol. I, XP010133479, Apr. 1994, pp. I/525-I/528.

Satoshi Miki, et al., "A pitch synchronous innovation celp (PSI-CELP) coder for 2-4 kbit/s", Proceedings of the International Conference on Acoustics, Speech, and Signal Processing (ICASSP), XP032107204, Apr. 1994, pp. II/113-II/116.

U.S. Appl. No. 13/807,139, filed Dec. 27, 2012, Fukui, et al.

Office Action issued May 21, 2013, in Japanese Patent Application No. 2012-523858 with English translation.

International Telecommunication Union, ITU-T Telecommunication Standardization Sector of ITU, G.729.1, Series G: Transmission Systems and Media, Digital Systems and Networks, Digital terminal equipments—Coding of analogue signals by methods other than PCM, G.729-based embedded variable bit-rate coder: An 8-32 kbit/s scalable wideband coder bistream interoperable with G.729, ITU-T Recommendation G.729.1, Total 98 pages, (May 2006).

International Telecommunication Union, ITU-T, Telecommunication Standardization Sector of ITU, G.718, Series G: Transmission Systems and Media, Digital Systems and Networks, Digital terminal equipments—Coding of voice and audio signals, Frame error robust narrow-band and wideband embedded variable bit-rate coding of speech and audio from 8-32 kbit/s, Recommendation ITU-T G.718, Total 254 pages, (Jun. 2008).

International Search Report Issued Aug. 30, 2011 in PCT/JP11/65275 Filed Jul. 4, 2011.

Office Action issued Mar. 20, 2015 in European Patent Application No. 11 803 545.0.

Laura Enflo, "Vowel Dependence for Electroglottography and Audio Spectral Tilt" Proceedings of Fonetik, XP55176346A, Feb. 6, 2010, 5 Pages.

* cited by examiner

ENCODING METHOD, DECODING METHOD, ENCODING DEVICE, DECODING DEVICE, AND RECORDING MEDIUM FOR A PLURALITY OF SAMPLES

TECHNICAL FIELD

The present invention relates to a technology for encoding or decoding signal sequences of acoustic signals, video signals, and other signals, such as voice and music, by vector quantization.

BACKGROUND ART

In an encoding device disclosed in Patent Literature 1, an input signal is first divided by a normalization value to perform normalization. The normalization value is quantized, and a quantization index is generated. The normalized input signal is vector-quantized, and an index of a representative quantization vector is generated. The generated quantization index and the generated representative quantization vector are output to a decoding device. The decoding device decodes the quantization index and generates a normalization value. The index of the representative quantization vector is also decoded, and a sample sequence is generated. A sequence of the values obtained by multiplying each sample in the generated sample sequence by the normalization value serves as a decoded signal sample sequence.

On the other hand, as highly efficient vector quantization methods that generate little quantization noise, the spherical vector quantization (SVQ) method (refer to Non-Patent Literature 1, for example) and other vector quantization methods that quantize a plurality of input signals together within a predetermined number of quantization bits are widely used.

In the SVQ method, samples of input signals such as modified discrete cosine transform (MDCT) coefficients are normalized by using a quantized normalization value, and the normalized samples are quantized together in units of subbands. Here, the number of bits (quantization bits) are dynamically assigned to a code corresponding to each subband in accordance with perceptual importance of each subband. Assuming that the input signals are sparse, the SVQ method quantizes the main elements of the input signals preferentially. Therefore, input signals having sparse energy in the frequency domain (sparse signals), such as harmonics signals and vowels, can be quantized with high precision.

However, the SVQ method increases the frequency that a frequency component included in the input signals is not included in decoded signals decoded from the quantized values (the decoded signals lack the frequency component) when the samples are quantized for input signals having energy in many frequencies. When the decoded signals lack a frequency component, the presence or absence of the frequency component in the decoded signals varies discontinuously over time at a high frequency. Humans are sensitive to those temporally discontinuous variations in the presence or absence of a frequency component. If the input signals are acoustic signals, these variations may be perceived as noise which is known as musical noise. If the input signals are video signals, block noise, which is equivalent to musical noise in the acoustic signals, may occur. Musical noise and block noise will be referred to as "musical noise and the like" below.

An algebraic vector quantization (AVQ) method (refer to Non-Patent Literature 2, for example) is a vector quantization method in which the decoded signals lack a frequency component at a lower frequency than with the SVQ method. Like the SVQ method, the AVQ method assumes that the signals are sparse, but the AVQ method can provide quantized values with which more frequency components can be restored than with the SVQ method.

Patent Literature 1: Japanese Patent Application Laid Open No. 07-261800

Non-Patent Literature 1: Recommendation ITU-T G729.1, SERIES G: TRANSMISSION SYSTEMS AND MEDIA, DIGITAL SYSTEMS AND NETWORKS, Digital terminal equipments—Coding of analogue signals by methods other than PCM, G729-based embedded variable bit-rate coder: An 8-32 kbit/s scalable wideband coder bitstream interoperable with G.729.

Non-Patent Literature 2: Recommendation ITU-T G718, SERIES G: TRANSMISSION SYSTEMS AND MEDIA, DIGITAL SYSTEMS AND NETWORKS, Digital terminal equipments—Coding of voice and audio signals, Frame error robust narrow-band and wideband embedded variable bit-rate coding of speech and audio from 8-32 kbit/s.

DISCLOSURE OF THE INVENTION

Problems to be Solved by the Invention

The amplitude quantization precision of the AVQ method is lower than that of the SVQ method, however. Even if the decoded signals lack a frequency component at a low frequency, low amplitude quantization precision could cause musical noise and the like. This problem is not limited to the AVQ method, and is common when musical noise and the like occur depending on the quantization precision. This problem can occur not only when the input signals are frequency-domain signals but also when the input signals are time-domain signals.

The present invention provides a technology for reducing musical noise and the like that can occur depending on the quantization precision.

Means to Solve the Problems

In encoding, index information indicating a group of coefficients that minimizes the sum of the error between the value of each sample and the value obtained by multiplying the quantized value of the sample by a coefficient corresponding to the position of the sample, for all the sample positions, among a plurality of groups of predetermined coefficients corresponding to the positions of the samples, is output. In decoding, a plurality of values corresponding to an input vector quantization index are obtained as decoded values corresponding to a plurality of sample positions; and, with the use of a group of predetermined coefficients corresponding to the plurality of sample positions and indicated by input index information, the values obtained by multiplying the decoded values and the coefficients, corresponding to the sample positions are output.

Effects of the Invention

In encoding, since index information indicating a group of a plurality of coefficients by which the quantized values of a plurality of samples are respectively multiplied is output, the quantization error in decoding can be reduced, and consequently, musical noise and the like can be reduced.

In decoding, since a plurality of decoded values are multiplied by a plurality of coefficients indicated by index information, the quantization error can be reduced, and consequently, musical noise and the like can be reduced.

DETAILED DESCRIPTION OF THE EMBODIMENTS

An embodiment of the present invention will now be described in detail.

Figure 1:
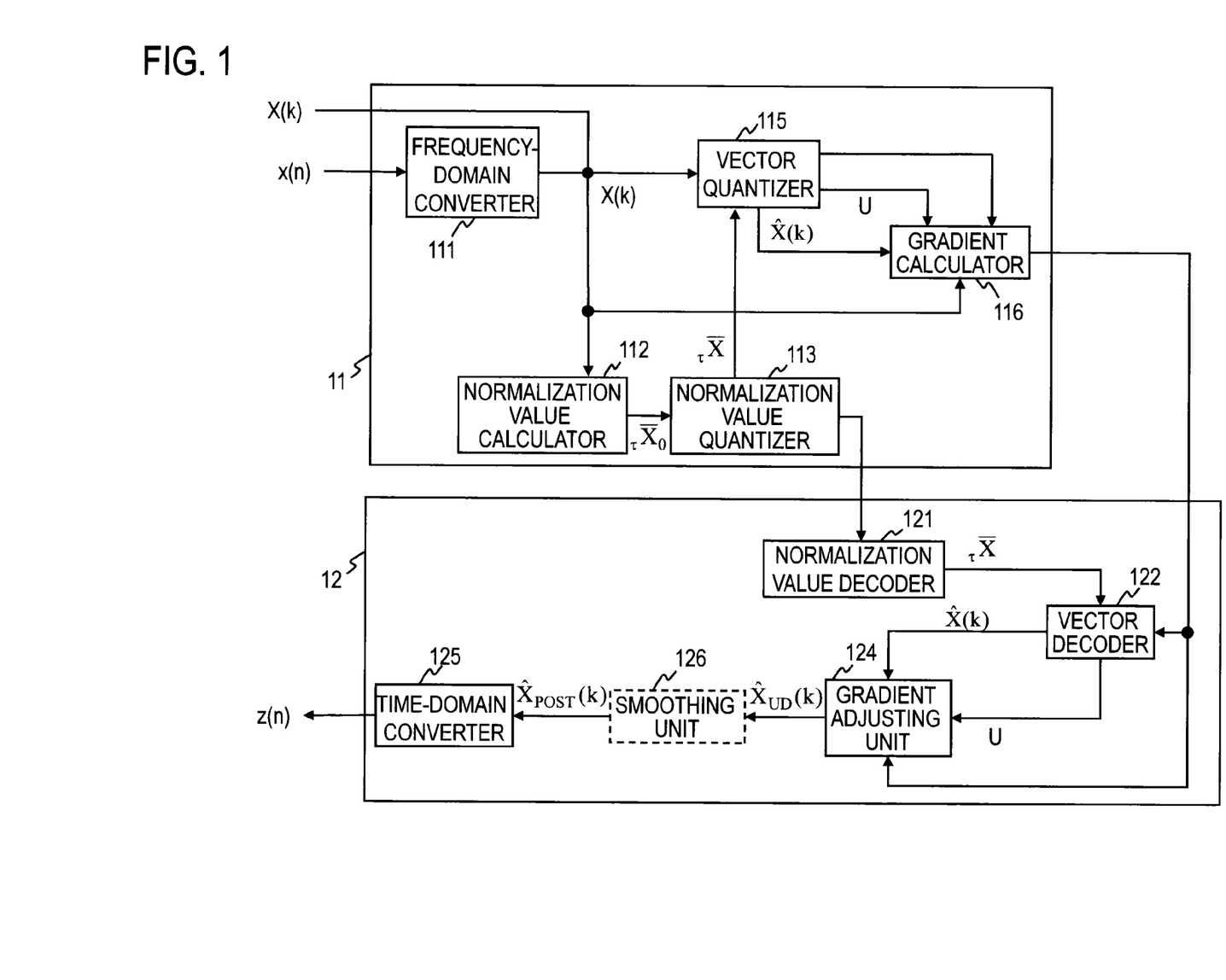
FIG. 1 is a functional block diagram of an encoding device and a decoding device.

(Configuration) As shown in FIG. 1, an encoding device 11 in this embodiment includes a normalization value calculator 112, a normalization value quantizer 113, a vector quantizer 115, and a gradient calculator 116 (corresponding to a coefficient group selection unit), for example.

As shown in FIG. 1, a decoding device 12 in this embodiment includes a normalization value decoder 121, a vector decoder 122, and a gradient adjusting unit 124, for example. The encoding device 11 may include a frequency-domain converter 111, for example, when necessary. The decoding device 12 may include a time-domain converter 125 and a smoothing unit 126, for example.

(Encoding)

Figure 2:
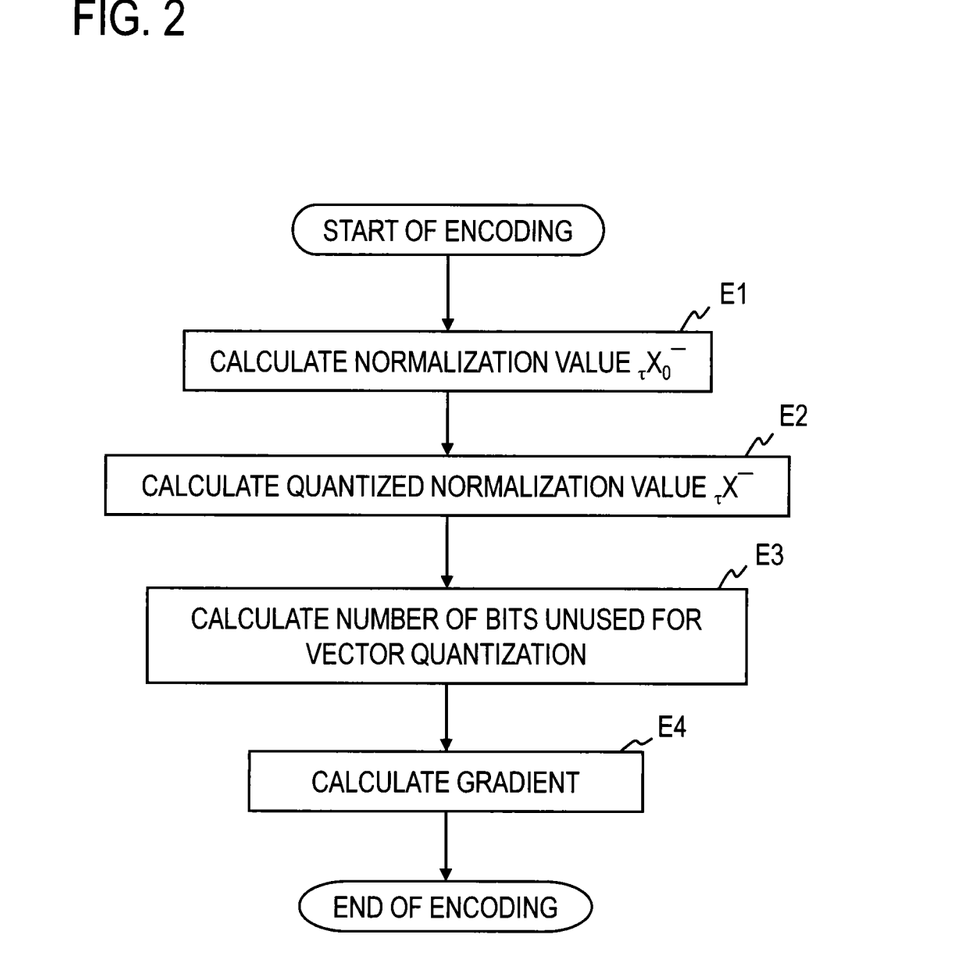
FIG. 2 is a flowchart illustrating an encoding method.

The encoding device 11 executes the steps of an encoding method illustrated in FIG. 2.

Input signals $X(k)$ are input to the normalization value calculator 112, the vector quantizer 115, and the gradient calculator 116. The input signals $X(k)$ here are frequency-domain signals that can be obtained by transforming time-domain signals $x(n)$, which are time-series signals such as acoustic signals, into the frequency domain. The input signals $X(k)$ in the frequency domain may be input directly to the encoding device 11. Alternatively, the frequency-domain converter 111 may transform the input signals $x(n)$ in the time domain into the frequency domain to generate the input signals $X(k)$ in the frequency domain. When the frequency-domain converter 111 generates the input signals $X(k)$ in the frequency domain, the frequency-domain converter 111 transforms the input signals $x(n)$ in the time domain to the input signals $X(k)$ in the frequency domain by modified discrete cosine transform (MDCT), for example. Here, n indicates the number (discrete time number) of the signals in the time domain, and k indicates the number (discrete frequency number) of the signals (samples) in the frequency domain. A larger n value corresponds to a later time. A larger k value corresponds to a higher frequency. When a single frame includes L samples, the time-domain signals $x(n)$ are transformed into the frequency domain in units of frames, and the input signals $X(k)$ ($k=0, 1, \ldots, L-1$) forming L frequency components in the frequency domain are generated. Here, L is a given positive integer greater than 1, such as 64 or 80. When MDCT is used, the input time-series signals are transformed into the frequency domain in units of frames each including L samples, and the frame to be transformed shifts by ½ frame, or L/2 samples at a time.

The normalization value calculator 112 calculates a normalization value $_\tau X_0^-$, which is a value representing a predetermined $C_0$ samples out of L samples of the input signals $X(k)$, in each frame (step E1). Here, $_\tau X_0^-$ is the character $_\tau X_0$ with an overbar, where $\tau$ is a unique integer not smaller than 0, assigned to each sub-band formed of the predetermined $C_0$ samples in L samples in a single frame.

$C_0$ is L or a common divisor of L other than 1 or L. Setting $C_0$ to L means that a normalization value is obtained for each group of L samples. Setting $C_0$ to a common divisor of L other than 1 or L means that the group of L samples is divided into sub-bands, and a normalization value is obtained for each group of $C_0$ samples constituting each sub-band. For example, when $L=64$ and when eight frequency components constitute a sub-band, eight sub-bands are formed, and a normalization value is calculated for each sub-band. When $C_0$ is L, $\tau=0$, and the normalization value $_\tau X_0^-$ represents L samples. In other words, when $C_0$ is L, a single normalization value $_\tau X_0^-$ is calculated for each frame. When $C_0$ is a common divisor of L other than 1 or L, $\tau$ is an integer $\tau=0, \ldots, (L/C_0)-1$ corresponding to each sub-band in the single frame, and the normalization value $_\tau X_0^-$ is a value representing $C_0$ samples included in the sub-frame corresponding to $\tau$. That is, when $C_0$ is a common divisor of L other than 1 or L, $L/C_0$ normalization values $_\tau X_0^-$ ($\tau=0, \ldots, (L/C_0)-1$) are calculated for each frame. Independently of the value of $C_0$, $k=\tau \cdot C_0, \ldots, (\tau+1) \cdot C_0-1$. The value $_\tau X_0^-$ calculated by the normalization value calculator 112 is sent to the normalization value quantizer 113.

[Examples of Normalization Value $_\tau X_0^-$]

The normalization value $_\tau X_0^-$ is a representative value of $C_0$ samples. In other words, the normalization value $_\tau X_0^-$ is a value that corresponds to $C_0$ samples. An example of the normalization value $_\tau X_0^-$ is the following square root to a power average value of the $C_0$ samples.

$$_\tau \overline{X}_0 = \sqrt{\frac{\sum_{k=\tau \cdot C_0}^{(\tau+1) \cdot C_0-1} X(k)^2}{C_0}}$$

Another example of the normalization value $_\tau X_0^-$ is the following value, which is obtained by dividing, by $C_0$, the square root to a total power value of the $C_0$ samples.

$$_\tau \overline{X}_0 = \frac{\sqrt{\sum_{k=\tau \cdot C_0}^{(\tau+1) \cdot C_0-1} X(k)^2}}{C_0}$$

Still another example of the normalization value $_\tau X_0^-$ is the following average amplitude value of the $C_0$ samples.

$$_\tau \overline{X}_0 = \frac{\sum_{k=\tau \cdot C_0}^{(\tau+1) \cdot C_0-1} |X(k)|}{C_0}$$

The normalization value $_\tau X_0^-$ is not limited to the examples given above (the description of [Examples of normalization value $_\tau X_0^-$] ends here).

The normalization value quantizer 113 quantizes the normalization value $_\tau X^-$ to obtain a quantized normalization value $_\tau X^-$ and obtains a normalization-value quantization index corresponding to the quantized normalization value $_\tau X^-$ (step E2). Here, $_\tau X^-$ is the character $_\tau X$ with an overbar. The quantized normalization value $_\tau X^-$ is sent to the vector quantizer 115, and a code (bit stream) corresponding to the normalization-value quantization index is sent to the decoding device 12.

The vector quantizer 115 generates a vector quantization index by collectively vector-quantizing a plurality of samples X(k) out of L samples of the input signals X(k) in each frame. The vector quantization index is an index indicating a representative quantization vector. The vector quantizer 115 here normalizes a plurality of X(k)'s by using the quantized normalization value $_\tau X^-$ and obtains a plurality of normalized samples X(k)'. For example, the vector quantizer 115 obtains X(k)' by dividing X(k) by $_\tau X^-$ or by multiplying X(k) by the reciprocal of $_\tau X^-$. The vector quantizer 115 performs vector quantization by selecting a representative quantization vector closest to the vector composed of the plurality of samples X(k)', out of a plurality of representative quantization vectors stored in a vector codebook storage, which is not shown in the drawings, and outputting a vector quantization index indicating the selected representative quantization vector, for example. The vector quantizer 115 vector-quantizes $C_0$ samples X(k)' together, for example. The vector quantizer 115 performs vector quantization by using a vector quantization method such as the AVQ method (refer to Non-Patent Literature 2, for example), but any other vector quantization method may be used. When $C_0$ is the number of samples in the sub-band, vector quantization may be unperformed on a sub-band with a low priority given in accordance with human auditory perceptual characteristics. A sub-band corresponding to a frequency that is easier to be perceived by humans is given a higher priority, for example. A sub-band having a greater quantized normalization value $_\tau X^-$ is given a higher priority, for example.

The bit number of a code obtained by the vector quantization varies depending on the input signals. For some input signals, the bit number of a code (the vector quantization index or the like) obtained by the vector quantization may be less than a bit number assigned for the vector quantization, and part of bits assigned for the vector quantization may remain unused. The "bits assigned for the vector quantization" mean bits assigned for a code (a code corresponding to the vector quantization index) obtained by the vector quantization, among codes sent from the encoding device 11 to the decoding device 12. The "bit number assigned for the vector quantization" means the bit number of the bits assigned for the vector quantization. The "bit number assigned for the vector quantization" may be determined for each frame, or may be determined for each sub-band. In addition, the "bit number assigned for the vector quantization" may vary depending on the input signal, or may be constant irrespective of the input signal. The vector quantizer 115 calculates the number of bits that are not used in actual vector quantization, among the bits assigned for vector quantization, as the number of unused bits, U. In this embodiment, the number of unused bits, U, is calculated in each frame (in units of L samples). For example, the vector quantizer 115 obtains the number of unused bits, U, by subtracting, from the number of bits assigned for vector quantization in a target frame to be processed, the total number of bits of the vector quantization index obtained by vector quantization of L samples included actually in the frame. Here, U is an integer not smaller than 0.

The vector quantizer 115 further obtains a plurality of quantized values X^(k), which are local-decoded values of the vector quantization index, and outputs them. For example, the vector quantizer 115 outputs the values obtained by denormalizing the components X(k)' of the representative quantization vector indicated by the vector quantization index, by using the quantized normalization value $_\tau X^-$, as the quantized values X^(k) of X(k). For example, the vector quantizer 115 outputs the products of X(K)' and $_\tau X^-$ as quantized values X^(k). Here, the quantized values X^(k) equal the decoded values X^(k) obtained by the decoding device 12. The quantized values X^(k) of a sub-band that is not subjected to vector quantization become 0. Here, X^ indicates X with a superscript caret immediately above it.

The vector quantizer 115 sends the vector quantization index, the number of unused bits, U, and the quantized values X^(k) to the gradient calculator 116 (step E3).

The gradient calculator 116 holds $M_{MAX}$ groups of $C_0$ gradient coefficients (tilt correction gains), for example, in a storage, which is not shown in the drawings. Here, $M_{MAX}$ is an integer not smaller than 2. For example, the gradient calculator 116 holds a gradient matrix γ given by Equation (1) where a gradient coefficient vector $γ_m=[γ_m(0), \ldots γ_m(C_0-1)]$ (a group of a plurality of gradient coefficients) composed of $C_0$ gradient coefficients (tilt correction gains) $γ_m(k)$ (k=0, ..., $C_0-1$) is provided as a row vector in the m-th row (m=0, ..., $M_{MAX}-1$).

$$\gamma = \begin{bmatrix} \gamma_0(0) & \cdots & \gamma_0(k) & \cdots & \gamma_0(C_0-1) \\ \vdots & \ddots & & & \vdots \\ \gamma_m(0) & & \gamma_m(k) & & \gamma_m(C_0-1) \\ \vdots & & & \ddots & \vdots \\ \gamma_{M_{MAX}-1}(0) & \cdots & \gamma_{M_{MAX}-1}(k) & \cdots & \gamma_{M_{MAX}-1}(C_0-1) \end{bmatrix} \quad (1)$$

The gradient calculator 116 obtains, for each frame, the row number m' of the gradient coefficient vector that minimizes the error between a first vector composed of values corresponding to $C_0$ samples X(k) (k=0, ..., $C_0-1$) among the L samples of the input signals X(k) and a second vector composed of values corresponding to $C_0$ adjusted values obtained by adjusting the quantized values X^(k) (k=0, ..., $C_0-1$) of the $C_0$ samples X(k) respectively with the elements $γ_m(k)$ of the gradient coefficient vector $γ_m$, and writes index information idx indicating the row number m' in the region of bits that are not used (referred to as an unused bit region), out of the bits assigned for vector quantization.

In other words, the gradient calculator 116 finds, from a gradient matrix γ having gradient coefficient vectors $γ_m$ each composed of a plurality of gradient coefficients $γ_m(k)$ as row vectors, the gradient coefficient vector that minimizes the error between a first vector composed of values corresponding to a plurality of samples X(k) and a second vector composed of values corresponding to the plurality of adjusted values obtained by adjusting the plurality of quantized values X^(k) with the elements of the gradient coefficient vector $γ_m$, outputs index information idx indicating the row number m' of that gradient coefficient vector, and places it in the unused bit region of the code (bit stream) corresponding to the vector quantization index.

More specifically, the gradient calculator 116 outputs, for example, index information idx indicating a group of coefficients $γ_m$ that minimizes the sum of the error between the value of each sample X(k) and the value obtained by multiplying the quantized value X^(k) of the sample by a coefficient $γ_m(k)$ corresponding to the position of the sample, for all the sample positions, among a plurality of groups of predetermined coefficients $γ_m(k)$ corresponding to the positions of the samples X(k). "The positions of the samples X(k)" in the present embodiment are the positions corresponding to the discrete frequency numbers k on the frequency axis (step E4).

With this step, the encoding device 11 can send information for adjusting the quantization error of the amplitude to the decoding device 12, using the unused bit region effectively, and can reduce musical noise and the like generated in accordance with the quantization precision.

The $C_0$ gradient coefficients $\gamma_m(0), \ldots, \gamma_m(C_0-1)$ constituting the gradient coefficient vector $\gamma_m$ are correlated with one another. In other words, each gradient coefficient vector $\gamma_m$ is a vector composed of a plurality of mutually correlated gradient coefficients $\gamma_m(0), \ldots, \gamma_m(C_0-1)$. It is the frequent case that $X(0), \ldots, X(C_0-1)$ are distributed lopsidedly on a straight line or a curve in a $(k, X(k))$ plane having k on its first axis and $X(k)$ on its second axis. By using the gradient coefficient vector $\gamma_m$ composed of the gradient coefficients $\gamma_m(0), \ldots, \gamma_m(C_0-1)$ with such characteristics of $X(0), \ldots, X(C_0-1)$ being taken into consideration, the quantization error can be adjusted with high precision. For example, it is assumed that the gradient coefficients $\gamma_m(0), \ldots, \gamma_m(C_0-1)$ corresponding to the same row number m are distributed lopsidedly on a straight line or a specific curve in a $(k, \gamma_m(k))$ plane having k (value corresponding to the frequency corresponding to the quantized value $X(k)$ to be multiplied by the gradient coefficient $\gamma_m(k)$, namely, value corresponding to the frequency corresponding to the gradient coefficient $\gamma_m(k)$) on its first axis and $\gamma_m(k)$ (value of the gradient coefficient) on its second axis. In other words, it is assumed, for example, that the gradient coefficient vector $\gamma_m$ is a vector composed of a plurality of gradient coefficients $\gamma_m(0), \ldots, \gamma_m(C_0-1)$ distributed lopsidedly on a straight line or a specific curve in the $(k, \gamma_m(k))$ plane having the value k corresponding to the column number on its first axis and the gradient coefficient $\gamma_m(k)$ of that column number on its second axis. More specifically, it is assumed, for example, that the gradient coefficients $\gamma_m(0), \ldots, \gamma_m(C_0-1)$ corresponding to the same row number m are placed on a straight line or a specific curve on the $(k, \gamma_m(k))$ plane. In other words, it is assumed that a vector composed of the gradient coefficients $\gamma_m(0), \ldots, \gamma_m(C_0-1)$ on a straight line or a specific curve in the $(k, \gamma_m(k))$ plane is provided as the gradient coefficient vector $\gamma_m$. The straight lines or specific curves in the $(k, \gamma_m(k))$ plane are different depending on the row numbers m, for example. An example of the gradient matrix $\gamma$ is shown below. The example shown is characterized by $C_0=8$ and $M_{MAX}=3$. In the example, the gradient coefficients $\gamma_m(0), \ldots, \gamma_m(7)$ are placed on a straight line given for each row number m (m=0, 1, 2).

$$\gamma = \begin{bmatrix} 1.35 & 1.25 & 1.15 & 1.05 & 0.95 & 0.85 & 0.75 & 0.65 \\ 1.175 & 1.125 & 1.075 & 1.025 & 0.975 & 0.925 & 0.875 & 0.825 \\ 0.65 & 0.75 & 0.85 & 0.95 & 1.05 & 1.15 & 1.25 & 1.35 \end{bmatrix}$$

Examples of the first vector include a vector composed of $C_0$ $X(k)$'s, a vector composed of the magnitude $|X(k)|$ of $C_0$ $X(k)$'s, and a vector composed of $C_0$ $X(k)$'s or $|X(k)|$'s multiplied by a constant or a variable. Examples of the second vector include a vector composed of $C_0$ adjusted values, a vector composed of the magnitude of the $C_0$ adjusted values, and a vector composed of $C_0$ adjusted values or their magnitude multiplied by a constant or a variable. Examples of adjusted values include the product of $X\hat{}(k)$ and $\gamma_m(k)$, the product of the magnitude $|X\hat{}(k)|$ of $X\hat{}(k)$ and $\gamma_m(k)$, the magnitude of the product of $X\hat{}(k)$ and $\gamma_m(k)$, a value indicating the magnitude of the product of $X\hat{}(k)$ and $\gamma_m(k)$, and a value corresponding to the product of $X\hat{}(k)$ and $\gamma_m(k)$.

An example of the error between the first vector and the second vector is the distance between the first vector and the second vector. The distance is not especially defined and can be the Manhattan distance, the Euclidean distance, variations of those distances, and the like. Examples of the gradient coefficient vector that minimizes the error between the first vector and the second vector include a gradient coefficient vector that minimizes the error between the first vector and the second vector and a gradient coefficient vector that minimizes the error between the first vector and the second vector under given search conditions or within a given search range.

The unused bit region can be identified by the reference position (first address, for example) of a determined unused bit region and the input number of unused bits, U. The upper limit of the number of bits of the index information idx that can be written in the unused bit region is the number of unused bits, U. Therefore, the index information idx corresponding to all the row numbers cannot always be written in the unused bit region. So, the gradient calculator 116 specifies the range of row numbers that can be identified by the index information idx that can be written in the unused bit region as the search range and selects the row number m'. In other words, the gradient calculator 116 selects just a row number m' indicated by index information idx that can be written in the unused bit region. More specifically, the gradient calculator 116 selects just a row number m' that can be identified by index information idx that can be expressed with the number of bits actually unused for a code corresponding to the vector quantization index among the number of bits assigned for the code corresponding to the vector quantization index. For example, the gradient calculator 116 identifies a row number m' as given below, among the $m_{MAX}$ row numbers m=0, ..., $m_{MAX}-1$ that can be identified by index information idx that can be written in the unused bit region, and writes index information idx corresponding to the row number m' in the unused bit region.

$$m' = \operatorname*{argmin}_{m} \|\chi - A_m \cdot \hat{\chi}\|$$

The symbol $\|\cdot\|$ indicates the norm of $\cdot$; $\operatorname{argmin}_m\|\cdot\|$ means that m minimizing $\|\cdot\|$ becomes m'; $\operatorname{argmin}_m$ means argmin with subscript m; and $\chi=[X(0), \ldots, X(C_0-1)]$, $\hat{\chi}=[X\hat{}(0), \ldots, X\hat{}(C_0-1)]$; and $A_m$ means a diagonal matrix having gradient coefficient vectors $\gamma_m=[\gamma_m(0), \ldots, \gamma_m(C_0-1)]$ corresponding to the row number m as its diagonal elements, as shown below.

$$A_m = \begin{bmatrix} \gamma_m(0) & & 0 \\ & \ddots & \\ 0 & & \gamma_m(C_0-1) \end{bmatrix}$$

The number of bits of the index information idx, described above, is equal to or smaller than the number of bits obtained by subtracting the number of bits actually used for a code corresponding to the vector quantization index from the number of bits assigned for the code corresponding to the vector quantization index. From the description above, the index information idx can be transmitted just by using the unused bit region.

[Example of Step E4]

Figure 3:
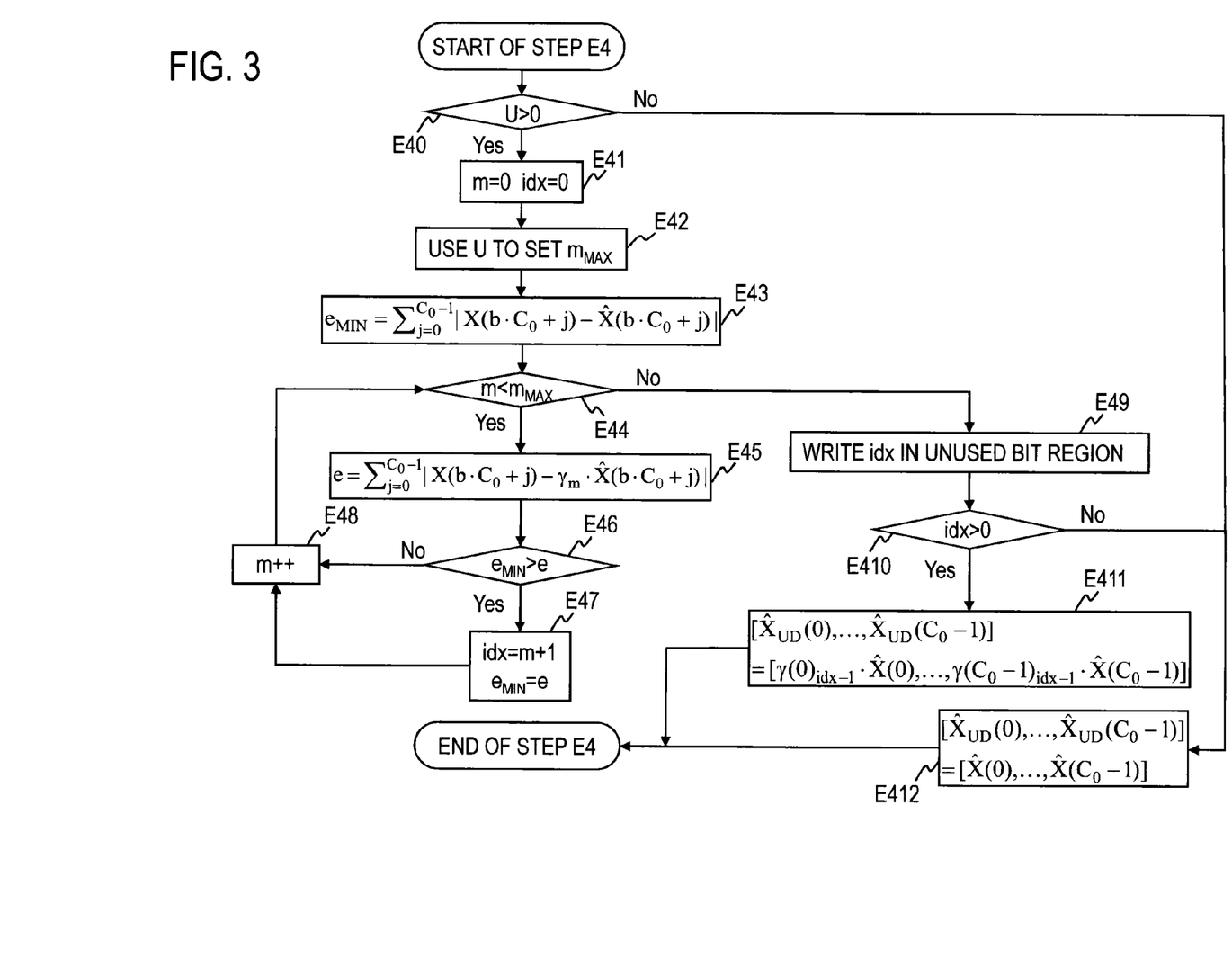
FIG. 3 is a flowchart illustrating an example of step E4.

The gradient calculator 116 in this example executes the steps shown in FIG. 3 to write the index information idx indicating the row number of the selected gradient coefficient vector in the unused bit region. When $C_0$ is L, the process of step E4 in FIG. 3 is executed for each frame. When $C_0$ is a common divisor of L other than 1 or L, the process of step E4 in FIG. 3 is repeatedly executed for each sub-band in a single frame.

The gradient calculator 116 compares the input number of unused bits, U, with 0 (step E40); and if U>0 is not satisfied, the gradient calculator 116 ends the process of step E4 without updating the plurality of input quantized values $\hat{X}(0), \ldots, \hat{X}(C_0-1)$, as shown below.

$$[\hat{X}_{UD}(b \cdot C_0), \ldots, \hat{X}_{UD}((b+1) \cdot C_0-1)] = [\hat{X}(b \cdot C_0), \ldots, \hat{X}((b+1) \cdot C_0-1)]$$

When U>0 is satisfied, the gradient calculator 116 initializes m and idx by setting m=0 and idx=0 (step E41) and proceeds to step E42.

In step E42, the gradient calculator 116 uses the number of unused bits, U, to specify the range of row numbers that can be identified by the index information idx that can be written in the unused bit region as the search range, and decides a search-range decision value $m_{MAX}$ for deciding the search range (the range of row numbers). In other words, the gradient calculator 116 obtains $m_{MAX}$ for deciding the number of row numbers that can be identified by the index information idx that can be written in the unused bit region (step E42).

Usually, the number of unused bits, U, can identify $2^U$ row numbers. Therefore, the search range may be set to the range of $2^U$ row numbers. In the current example, however, a value indicating that correction with the use of the gradient coefficient vector $\gamma_{m'}$ is not performed is assigned to one of the values of the index information idx, and the remaining number of values, $2^U-1$, are used as the search range of ($2^U-1$) row numbers. The relationship between the search range (the range of row numbers) and $m_{MAX}$ needs to be determined in advance. In the current example, $m_{MAX}$ is an integer equal to or larger than 1 and equal to or smaller than $2^U-1$ and also equal to or smaller than $M_{MAX}$, and the search range is row numbers $0, \ldots, m_{MAX}-1$. The gradient calculator 116 obtains $m_{MAX}$ by using the following equation, for example.

$$m_{MAX} = \max[\min\{2^U-1, M_{MAX}\}, 1]$$

The gradient calculator 116 performs the calculation indicated by the following equation (step E43).

$$e_{MIN} = \Sigma_{j=0}^{C_0-1} |X(b \cdot C_0+j) - \hat{X}(b \cdot C_0+j)| \quad (2)$$

The gradient calculator 116 compares m with $m_{MAX}$ (step E44); if $m < m_{MAX}$ is satisfied, the gradient calculator 116 calculates "e" by the equation below (step E45), and then compares $e_{MIN}$ with "e" (step E46). If $e_{MIN} > e$ is not satisfied, the gradient calculator 116 increments m by 1 (step E48), and the processing proceeds to step E44.

$$e = \Sigma_{j=0}^{C_0-1} |X(b \cdot C_0+j) - \gamma_m \cdot \hat{X}(b \cdot C_0+j)| \quad (3)$$

If $e_{MIN} > e$ is satisfied, the gradient calculator 116 updates idx and $e_{MIN}$ to idx=m+1 and $e_{MIN}=e$, respectively (step E47), increments m by 1 (step E48), and proceeds to step E44.

If $m < m_{MAX}$ is not satisfied in step E44, the gradient calculator 116 writes idx in the unused bit region (step E49). In the current example, the gradient calculator 116 is configured such that the decoding device 12 can decide where the necessary idx is placed in the unused bit region, according to $m_{MAX}$. For example, $m_{MAX}$ decides the position where idx is stored in the unused bit region.

Next, the gradient calculator 116 decides whether idx>0 (whether idx=0) is satisfied (step E410). If idx>0 is satisfied (idx=0 is not satisfied), the gradient calculator 116 updates a plurality of quantized values $\hat{X}(b \cdot C_0), \ldots, \hat{X}((b+1) \cdot C_0-1)$, which are local decoded values, as shown below (step E411), and finishes the process of step E4.

$$[\hat{X}_{UD}(b \cdot C_0), \ldots, \hat{X}_{UD}((b+1) \cdot C_0-1)] = [\gamma(0)_{idx-1} \cdot \hat{X}(b \cdot C_0), \ldots, \gamma(C_0-1)_{idx-1} \cdot \hat{X}((b+1) \cdot C_0-1)]$$

If idx>0 is not satisfied (idx=0 is satisfied), the gradient calculator 116 does not update a plurality of quantized values $\hat{X}(b \cdot C_0), \ldots, \hat{X}((b+1) \cdot C_0-1)$, which are local decoded values, as shown below (step E412) and finishes the process of step E4.

$$[\hat{X}_{UD}(b \cdot C_0), \ldots, \hat{X}_{UD}((b+1) \cdot C_0-1)] = [\hat{X}(b \cdot C_0), \ldots, \hat{X}((b+1) \cdot C_0-1)]$$

Note that, when $C_0$ is L, b=0. When $C_0$ is a common divisor of L other than 1 or L, b is one of the integers corresponding to the sub-bands in a single frame, $0, \ldots, (L/C_0)-1$. For example, b is the integer corresponding to the sub-band having the lowest frequency, 0. (End of the description of [Example of step E4])

The code (bit stream) corresponding to an modified vector quantization index that includes the vector quantization index and the index information idx written in the unused bit region is sent to the decoding device 12.

(Decoding)

Figure 4:
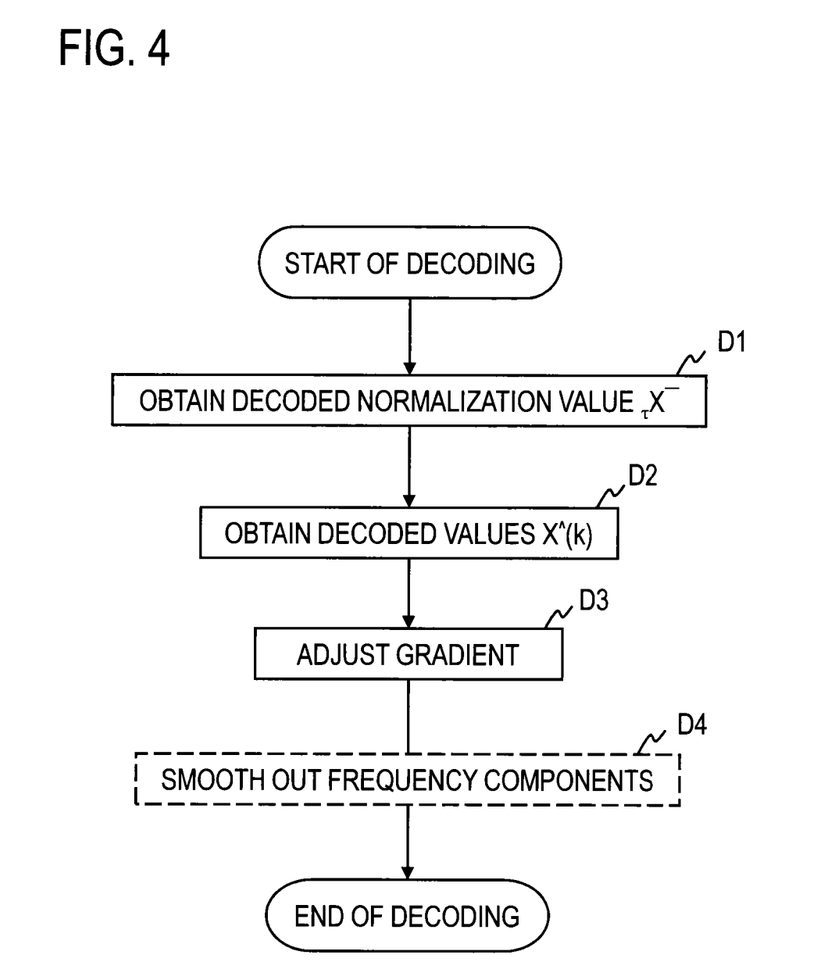
FIG. 4 is a flowchart illustrating a decoding method.

The decoding device 12 executes the steps of a decoding method illustrated in FIG. 4.

The normalization value decoder 121 obtains a decoded normalization value $_\tau X^-$ corresponding to the normalization-value quantization index input to the decoding device 12 (step D1). The decoded normalization value $_\tau X^-$ is sent to the vector decoder 122.

It is assumed that normalization values corresponding to a plurality of normalization-value quantization indexes are stored in a codebook storage, which is not shown in the drawings. The normalization value decoder 121 searches through the codebook storage by using the input normalization-value quantization index as a key and obtains the normalization value corresponding to the normalization-value quantization index as the decoded normalization value $_\tau X^-$.

The vector decoder 122 obtains a plurality of values corresponding to the vector quantization index included in the modified vector quantization index input to the decoding device 12, as a plurality of decoded values $\hat{X}(k)$. The vector decoder 122 calculates the number of unused bits, U, by using the vector quantization index (step D2).

In this embodiment, it is assumed that representative quantization vectors corresponding to the plurality of vector quantization indexes are stored in the vector codebook storage, which is not shown in the drawings. The vector decoder 122 searches through the vector codebook storage by using the representative quantization vector corresponding to the input vector quantization index as a key and obtains the representative quantization vector corresponding to the vector quantization index. The vector decoder 122 outputs the decoded values $\hat{X}(k)$ obtained by denormalizing the elements X(k)' of the representative quantization vector with the quantized normalization value $_\tau X^-$. The vector decoder 122 outputs the products of X(k)' and $_\tau X^-$ as decoded values $\hat{X}(k)$, for example.

The vector decoder 122 calculates the number of unused bits, U, that are not actually used in vector quantization, out of the bits assigned for vector quantization. In this embodiment, the vector decoder 122 calculates the number of unused bits, U, in each frame (in units of L samples). For example, the vector decoder 122 calculates the number of unused bits, U, by subtracting, from the number of bits assigned for vector quantization in the target frame to be processed, the total number of bits of the vector quantization index corresponding to the frame.

The decoded values $\hat{X}(k)$ and the number of unused bits, U, are sent to the gradient adjusting unit 124.

The gradient adjusting unit 124 holds the same gradient matrix γ (see Equation (1)) as that used in the encoding device 11, in a storage, which is not shown in the drawings, for example The gradient adjusting unit 124 reads the index information idx from the unused bit region included in the modified vector quantization index input to the decoding device 12 and adjusts the $C_0$ decoded values $\hat{X}(k)$ (k=0, ..., $C_0$−1) by using the elements $\gamma_{m'}(k)$ (k=0, ..., $C_0$−1) of the gradient coefficient vector $\gamma_{m'}$ of the row number m' indicated by idx. In other words, the gradient adjusting unit 124 adjusts the plurality of decoded values $\hat{X}(k)$ by using the elements $\gamma_{m'}(k)$ of the gradient coefficient vector $\gamma_{m'}$ of the row number m' indicated by the index information idx in the gradient matrix γ having, as row vectors, the gradient coefficient vectors $\gamma_m$ composed of a plurality of gradient coefficients $\gamma_m(k)$ (step D3). The gradient adjusting unit 124 obtains, for example, the products of the decoded values $\hat{X}(k)$ and the elements $\gamma_{m'}(k)$ of the gradient coefficient vector $\gamma_{m'}$ of the row number m' indicated by the index information idx, as adjusted values $\hat{X}_{UD}(k)$ of the decoded values $\hat{X}(k)$. The gradient adjusting unit 124 outputs the adjusted values $\hat{X}_{UD}(k)$. In other words, the gradient adjusting unit 124 uses a group of predetermined coefficients $\gamma_{m'}(k)$ corresponding to the plurality of sample positions, indicated by the input index information idx, and outputs the products of the coefficients $\gamma_{m'}(k)$ and the decoded values $\hat{X}(k)$, corresponding to the respective sample positions.

[Example of Step D3]

Figure 5:
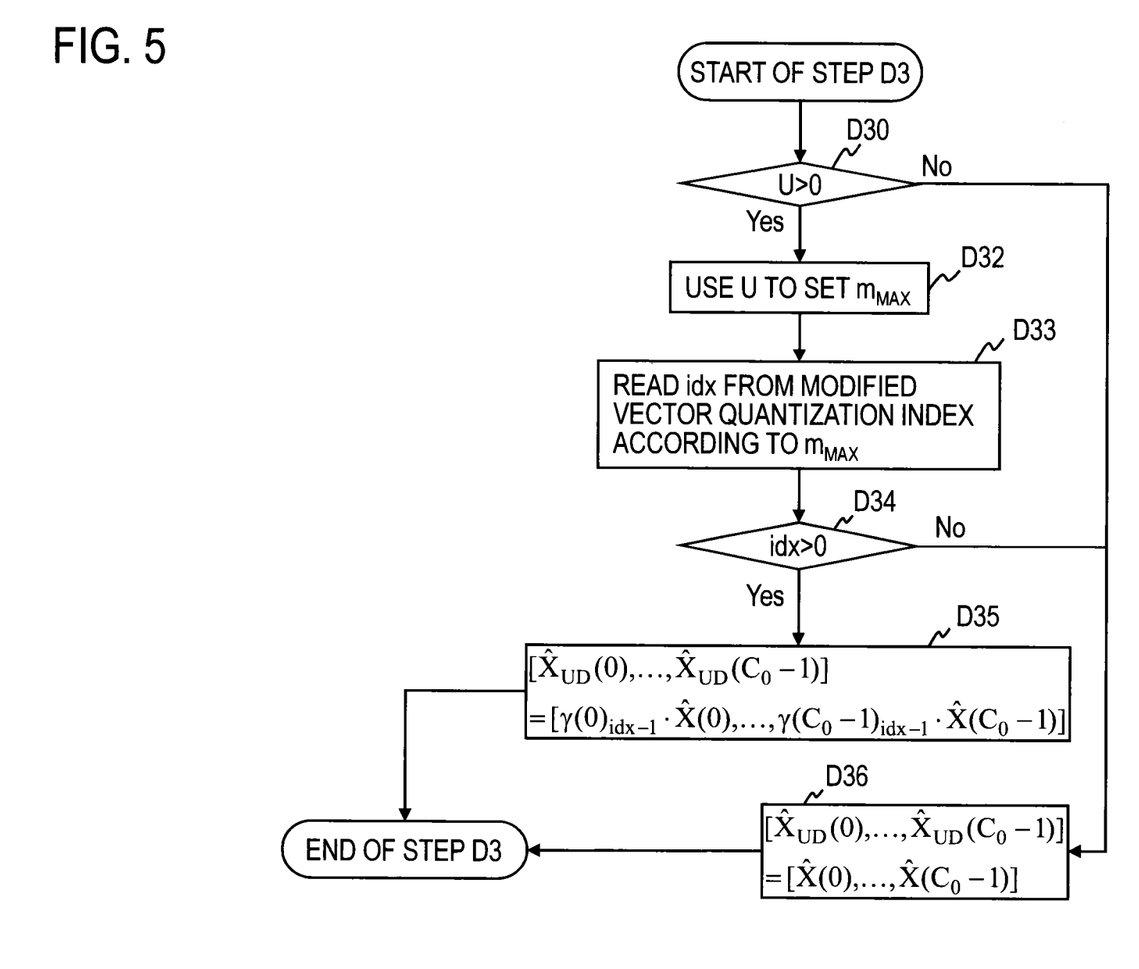
FIG. 5 is a flowchart illustrating an example of step D3.

The gradient adjusting unit 124 in this example performs the steps illustrated in FIG. 5 and adjusts the decoded values $\hat{X}(k)$.

The gradient adjusting unit 124 compares the input number of unused bits, U, with 0 (step D30); if U>0 is not satisfied, the gradient adjusting unit 124 ends the process of step D3 without updating the plurality of input quantized values $\hat{X}(0), \ldots, \hat{X}(C_0-1)$, as shown below (step D36).

$$[\hat{X}_{UD}(b \cdot C_0), \ldots, \hat{X}_{UD}((b+1) \cdot C_0-1)] = [\hat{X}(b \cdot C_0), \ldots, \hat{X}((b+1) \cdot C_0-1)]$$

When U>0 is satisfied, the gradient adjusting unit 124 sets $m_{MAX}$ with the same method as in step E42, described above (step D32). For example, the gradient adjusting unit 124 obtains $m_{MAX}$ using the following equation.

$$m_{MAX} = \max[\min\{2^U-1, M_{MAX}\}, 1]$$

The gradient adjusting unit 124 reads the index information idx from the unused bit region of the modified vector quantization index, according to $m_{MAX}$ (step D33). For example, the gradient adjusting unit 124 decides the position where the index information idx is stored, according to $m_{MAX}$, and reads the index information idx.

The gradient adjusting unit 124 decides whether idx>0 (whether idx=0) is satisfied (step D34). If idx>0 is satisfied (idx=0 is not satisfied), the gradient adjusting unit 124 updates the plurality of quantized values $\hat{X}(b \cdot C_0), \ldots, \hat{X}((b+1) \cdot C_0-1)$, as shown below (step D35), and finishes the process of step D3.

$$[\hat{X}_{UD}(b \cdot C_0), \ldots, \hat{X}_{UD}((b+1) \cdot C_0-1)] = [\gamma(0)_{idx-1} \cdot \hat{X}(b \cdot C_0), \ldots, \gamma(C_0-1)_{idx-1} \cdot \hat{X}((b+1) \cdot C_0-1)]$$

If idx>0 is not satisfied (idx=0 is satisfied), the gradient adjusting unit 124 finishes the process of step D3 without updating the plurality of decoded values $\hat{X}(b \cdot C_0), \ldots, \hat{X}((b+1) \cdot C_0-1)$ (step D36), as shown below.

$$[\hat{X}_{UD}(b \cdot C_0), \ldots, \hat{X}_{UD}((b+1) \cdot C_0-1)] = [\hat{X}(b \cdot C_0), \ldots, \hat{X}((b+1) \cdot C_0-1)]$$

The description of [Example of step D3] ends here.

If decoded signals in the time domain are necessary, the adjusted values $\hat{X}_{UD}(k)$ output from the gradient adjusting unit 124 are input to the time-domain converter 125, and the time-domain converter 125 transforms $\hat{X}_{UD}(k)$ to time-domain signals z(n) by an inverse Fourier transform, for example.

Features of this Embodiment

As described above, since the decoding device 12 adjusts a plurality of decoded values $\hat{X}(k)$ by using the gradient coefficient vector selected by the encoding device 11 in this embodiment, musical noise and the like caused by the quantization error can be reduced.

Figure 6:
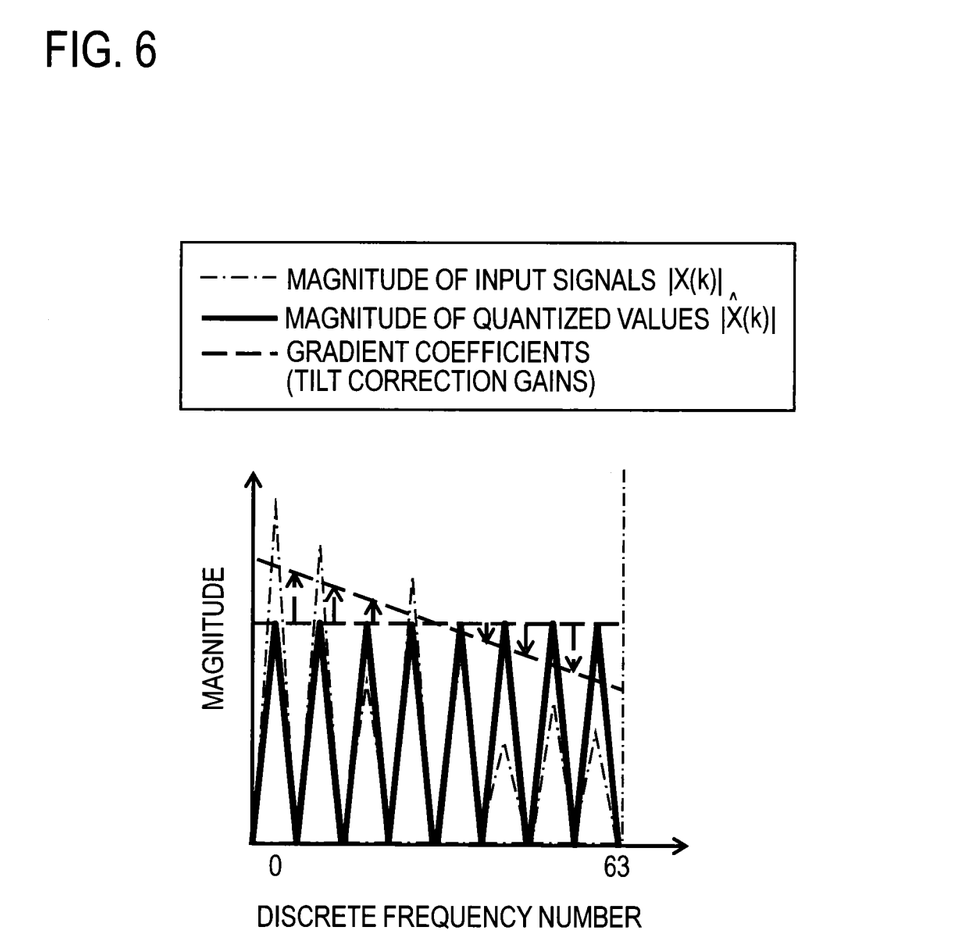
FIG. 6 illustrates an example of the relationship among input signals, quantized values, and gradient coefficients (tilt correction gains).

A vector composed of gradient coefficients $\gamma_m(0), \ldots, \gamma_m(C_0-1)$ that are correlated with one another is specified as a gradient coefficient vector $\gamma_m$ in this embodiment. For example, the gradient coefficient vector $\gamma_m$ is a vector composed of a plurality of gradient coefficients $\gamma_m(0), \ldots, \gamma_m(C_0-1)$ distributed lopsidedly on a straight line or a specific curve in the (k, $\gamma_m(k)$) plane, for example. Input signals such as audio signals or acoustic signals often form a linear or curved envelope. By using the gradient coefficient vector $\gamma_m$ reflecting such characteristics of the input signals, the amount of index information idx can be suppressed while still adjusting the quantization error with high precision. In the example shown in FIG. 6, the magnitude |X(k)| of the input signals in sub-bands k=0, ..., 63 decreases as k increases. Therefore, by adjusting |X(0)|, ..., |X(63)| by using the gradient coefficient vector $\gamma_m$ composed of gradient coefficients $\gamma_m(0), \ldots, \gamma_m(63)$ distributed lopsidedly on a straight line with a negative gradient in the (k, $\gamma_m(k)$) plane, their errors from the magnitudes |$\hat{X}(0)$|, ..., |$\hat{X}(63)$| of the quantized values can be reduced. By using the gradient coefficient vector $\gamma_m$ suitable for the characteristics of the input signals in each sub-band as described above, the quantization error can be reduced efficiently.

The index information idx for identifying the gradient coefficient vector $\gamma_{m'}$ selected by the encoding device 11 is transmitted by using the unused bit region effectively, eliminating the need for an additional region for transmitting the index information idx.

Modifications

The present invention is not limited to the embodiment described above. For example, if the decoding device 12 includes the smoothing unit 126, the smoothing unit 126 receives the adjusted value $\hat{X}_{UD}(k)$ obtained in step D3 (FIG. 4) and, if an adjusted value $\hat{X}_{UD}(k)'$ older than the adjusted value $\hat{X}_{UD}(k)$ is not 0, outputs a weighted sum of the older adjusted value $\hat{X}_{UD}(k)'$ and the current adjusted value $\hat{X}_{UD}(k)$ as a smoothed value $\hat{X}_{POST}(k)$. If $\hat{X}_{UD}(k)'$ is 0, the smoothing unit 126 does not obtain the weighted sum of the adjusted values, which means that the smoothing unit 126 does not smooth out the adjusted values, but outputs $\hat{X}_{UD}(k)$ as $\hat{X}_{POST}(k)$ (step D4 in FIG. 4). Examples of the older adjusted value $\hat{X}_{UD}(k)'$ include an adjusted value obtained in step D3 for the frame immediately before the frame corresponding to the adjusted value $\hat{X}_{UD}(k)$ and a smoothed value obtained in step D4 for the frame immediately before the frame corresponding to the adjusted value $\hat{X}_{UD}(k)$.

$\hat{X}_{POST}(k)$ is given by the following equations, where α and β are adjustment factors and are determined appropriately depending on the requirements and specifications. For example, α=0.85 and β=0.15. α and β may be changed appropriately depending on the requirements and specifications. φ(·) indicates a plus or minus sign of $$\begin{cases} \hat{X}_{POST}(k) = \hat{X}_{UD}(k) & \text{if } \hat{X}_{UD}(k)' = 0 \\ \hat{X}_{POST}(k) & \text{otherwise} \\ = \{\alpha \cdot |\hat{X}_{UD}(k)| + \beta \cdot |\hat{X}_{UD}(k)'|\} \cdot \phi(\hat{X}_{UD}(k)) \end{cases} \quad (5)$$

Consequently, musical noise and the like caused by the discontinuity over time in the amplitude characteristics of $\hat{X}_{UD}(k)$ can be reduced. If decoded signals in the time domain are necessary, $\hat{X}_{POST}(k)$ output from the smoothing unit 126 is input to the time-domain converter 125. The time-domain converter 125 transforms $\hat{X}_{POST}(k)$ to time-domain signals z(n) by an inverse Fourier transform, for example.

The input signals X(k) do not need to be frequency-domain signals and can be any signals, such as time-domain signals. The present invention can be applied to encoding and decoding of any signals other than frequency-domain signals. In that case, the gradient coefficients $\gamma_m(0), \ldots, \gamma_m(C_0-1)$ corresponding to the same row number m are distributed lopsidedly on a straight line or a specific curve in the $(k, \gamma_m(k))$ plane having k (value corresponding to time corresponding to the quantized value $\hat{X}(k)$ to be multiplied by the gradient coefficient $\gamma_m(k)$, namely, value corresponding to time corresponding to the gradient coefficient $\gamma_m(k)$) on its first axis and $\gamma_m(k)$ (value of the gradient coefficient) on its second axis, for example. More specifically, the gradient coefficients $\gamma_m(0), \ldots, \gamma_m(C_0-1)$ corresponding to the same row number m are positioned on a straight line or a specific curve in the $(k, \gamma_m(k))$ plane, for example. In this modification, k is a discrete time number corresponding to discrete time, and the positions of samples X(k) are positions on the time axis corresponding to the discrete time numbers k. When k is a discrete time number, a larger value of k corresponds to a later time.

Step E3 may be executed such that a normalization value $F_{GAIN}$ for the input signals X(k) is determined in each frame, the vector quantizer 115 uses a value obtained by normalizing the value X(k) of each sample of the input signals with the normalization value $F_{GAIN}$ instead of X(k) and uses a value obtained by normalizing the quantized normalization value $_\tau \hat{X}^-$ with the normalization value $F_{GAIN}$ instead of $_\tau \hat{X}^-$. When step E3 is executed, X(k) may be replaced with X(k)/$F_{GAIN}$, and $_\tau \hat{X}^-$ may be replaced with $_\tau \hat{X}^-/F_{GAIN}$, for example. In that case, the normalization value calculator 112 is not necessary, and a value obtained by normalizing X(k) with the normalization value $F_{GAIN}$ may be input to the normalization value quantizer 113, instead of the quantized normalization value $_\tau \hat{X}^-$. Then, the vector quantizer 115 may execute step E3 by using a quantized value of a value obtained by normalizing X(k) with the normalization value $F_{GAIN}$ instead of the quantized normalization value $_\tau \hat{X}^-$. The normalization-value quantization index may correspond to a quantized value of a value obtained by normalization with the normalization value $F_{GAIN}$.

In the above-described embodiment, the gradient calculator 116 of the encoding device 11 decides whether idx>0 is satisfied and, if idx>0 is satisfied, updates a plurality of quantized values $\hat{X}(b \cdot C_0), \ldots, \hat{X}((b+1) \cdot C_0-1)$ or, if idx>0 is not satisfied, does not update the values (steps E410 to E412 in FIG. 3). The gradient adjusting unit 124 of the decoding device 12 decides whether idx>0 is satisfied and, if idx>0 is satisfied, updates a plurality of quantized values $\hat{X}(b \cdot C_0), \ldots, \hat{X}((b+1) \cdot C_0-1)$ or, if idx>0 is not satisfied, does not update the values (steps D34 to D36 in FIG. 5). As a modification, a row vector (gradient coefficient vector) $\gamma_{-1} = [\gamma_{-1}(0), \ldots, \gamma_{-1}(C_0-1)] = [1, \ldots, 1]$ of the row number m=−1, composed of only elements "1" is added to the gradient matrix $\gamma$ given by Equation (1), and the gradient calculator 116 and the gradient adjusting unit 124 may calculate the following, irrespective of whether idx>0 is satisfied.

$$[\hat{X}_{UD}(b \cdot C_0), \ldots, \hat{X}_{UD}((b+1) \cdot C_0-1)] = [\gamma(0)_{idx-1} \cdot \hat{X}(b \cdot C_0), \ldots, \gamma(C_0-1)_{idx-1} \cdot \hat{X}((b+1) \cdot C_0-1)]$$

The specific example values of the row number m and the index information idx do not limit the present invention. The numbers of m and idx given above may increase or decrease, and some of the numbers may be unused.

In the embodiment described above, the index information idx is stored in the unused bit region of U unused bits, but the index information idx may not be stored in the unused bit region.

The processing described above may be executed in the order in which it is described or may be executed in parallel or separately in accordance with the capabilities of the apparatus executing the processing or with necessity. Other modifications can be made without departing from the scope of the invention.

Hardware, program, and recording medium

The encoding device 11 and the decoding device 12 are configured by a known or special-purpose computer that includes a central processing unit (CPU) and a random access memory (RAM), and a special program in which the processing described above is written, for example. In that case, the special program is read into the CPU, and the CPU runs the special program to implement each function. The special program may be configured by a single program string or may carry out the objective by reading another program or library.

The program can be recorded on a computer-readable recording medium. Examples of the computer-readable recording medium include a magnetic recording apparatus, an optical disc, a magneto-optical recording medium, and a semiconductor memory. Examples of the computer-readable recording medium are non-transitory recording media. The program is distributed, for example, by selling, transferring, or lending a DVD, a CD-ROM, or other transportable recording media on which the program is recorded. The program may be stored in a storage of a server computer and may be distributed by transferring the program from the server computer to another computer through a network.

The computer that executes the program stores the program recorded on a transportable recording medium or the program transferred from the server computer, in its own memory. When the processing is executed, the computer reads the program stored in its own memory and executes the processing in accordance with the read program. The program may also be executed with other methods: The computer may read the program directly from the transportable recording medium and execute the processing in accordance with the program; and each time the program is transferred from the server computer to the computer, the processing may be executed according to the transferred program.

At least a part of the processing units of the encoding device 11 or the decoding device 12 may be configured by a special integrated circuit.

DESCRIPTION OF REFERENCE NUMERALS

11: Encoding device
111: Frequency-domain converter
112: Normalization value calculator
113: Normalization value quantizer
115: Vector quantizer
116: Gradient calculator
12: Decoding device 121: Normalization value decoder
122: Vector decoder
124: Gradient adjusting unit
125: Time-domain converter
126: Smoothing unit

What is claimed is:

1. An encoding method comprising:
vector-quantizing a plurality of samples collectively to obtain a vector quantization index and the quantized value of each of the plurality of samples; and
outputting index information indicating a group of coefficients that minimizes the sum of the error between the value of each sample and the value obtained by multiplying the quantized value of the sample by a coefficient corresponding to the position of the sample, for all sample positions, among a plurality of groups of predetermined coefficients corresponding to the positions of the samples,
wherein the groups of coefficients are each formed of coefficients disposed on a straight line in a plane having values corresponding to frequency or time corresponding to the sample positions with which the coefficients are associated on a first axis thereof and the values of the coefficients on a second axis thereof; and
the coefficients of each of the plurality of groups of coefficients are disposed in the plane on a straight line having a different gradient from straight lines for the other groups.

2. An encoding method comprising:
vector-quantizing a plurality of samples collectively to obtain a vector quantization index and the quantized value of each of the plurality of samples; and
outputting index information indicating a group of coefficients that minimizes the sum of the error between the value of each sample and the value obtained by multiplying the quantized value of the sample by a coefficient corresponding to the position of the sample, for all sample positions, among a plurality of groups of predetermined coefficients corresponding to the positions of the samples,
wherein the groups of coefficients are each formed of coefficients distributed lopsidedly on a straight line or a specific curve in a plane having values of frequency or time corresponding to the sample positions with which the coefficients are associated on a first axis thereof and the values of the coefficients on a second axis thereof; and
the coefficients of the plurality of groups of coefficients are disposed lopsidedly in the plane on straight lines that are not parallel to the first axis or specific curves.

3. The encoding method according to claim 1 or 2, wherein the number of bits of the index information output is equal to or smaller than the value obtained by subtracting the number of bits actually used for a code corresponding to the vector quantization index from the number of bits assigned for the code corresponding to the vector quantization index.

4. A non-transitory computer-readable recording medium having stored thereon a program for causing a computer to execute the encoding method according to claim 1 or 2.

5. A decoding method comprising:
obtaining a plurality of values corresponding to an input vector quantization index as decoded values corresponding to a plurality of sample positions; and
outputting, with the use of a group of predetermined coefficients corresponding to the plurality of sample positions and indicated by input index information, the values obtained by multiplying the decoded values and the coefficients, corresponding to the sample positions,
wherein the group of coefficients is formed of coefficients disposed on a straight line in a plane having values corresponding to frequency or time corresponding to the sample positions with which the coefficients are associated on a first axis thereof and the values of the coefficients on a second axis thereof; and
the coefficients of each of the plurality of groups of coefficients are disposed in the plane on a straight line having a different gradient from straight lines for the other groups.

6. A decoding method comprising:
obtaining a plurality of values corresponding to an input vector quantization index as decoded values corresponding to a plurality of sample positions; and
outputting, with the use of a group of predetermined coefficients corresponding to the plurality of sample positions and indicated by input index information, the values obtained by multiplying the decoded values and the coefficients, corresponding to the sample positions,
wherein the group of coefficients is formed of coefficients distributed lopsidedly on a straight line or a specific curve in a plane having values of frequency or time corresponding to the sample positions with which the coefficients are associated on a first axis thereof and the values of the coefficients on a second axis thereof; and
the coefficients of the plurality of groups of coefficients are disposed lopsidedly in the plane on straight lines that are not parallel to the first axis or specific curves.

7. A non-transitory computer-readable recording medium having stored thereon a program for causing a computer to execute the decoding method according to claim 5 or 6.

8. An encoding device comprising:
a vector quantizer that vector-quantizes a plurality of samples collectively to obtain a vector quantization index and the quantized value of each of the plurality of samples;
a coefficient group selector that outputs index information indicating a group of coefficients that minimizes the sum of the error between the value of each sample and the value obtained by multiplying the quantized value of the sample by a coefficient corresponding to the position of the sample, for all sample positions, among a plurality of groups of predetermined coefficients corresponding to the positions of the samples,
wherein the groups of coefficients are each formed of coefficients disposed on a straight line in a plane having values corresponding to frequency or time corresponding to the sample positions with which the coefficients are associated on a first axis thereof and the values of the coefficients on a second axis thereof; and
the coefficients of each of the plurality of groups of coefficients are disposed in the plane on a straight line having a different gradient from straight lines for the other groups.

9. An encoding device comprising:
a vector quantizer that vector-quantizes a plurality of samples collectively to obtain a vector quantization index and the quantized value of each of the plurality of samples; and
a coefficient group selector that outputs index information indicating a group of coefficients that minimizes the sum of the error between the value of each sample and the value obtained by multiplying the quantized value of the sample by a coefficient corresponding to the position of the sample, for all sample positions, among a plurality of groups of predetermined coefficients corresponding to the positions of the samples, wherein the groups of coefficients are each formed of coefficients distributed lopsidedly on a straight line or a specific curve in a plane having values of frequency or time corresponding to the sample positions with which the coefficients are associated on a first axis thereof and the values of the coefficients on a second axis thereof; and the coefficients of the plurality of groups of coefficients are disposed lopsidedly in the plane on straight lines that are not parallel to the first axis or specific curves.

10. The encoding device according to claim 8 or 9, wherein the number of bits of the index information output from the coefficient group selector is equal to or smaller than the value obtained by subtracting the number of bits actually used for a code corresponding to the vector quantization index from the number of bits assigned for the code corresponding to the vector quantization index.

11. A decoding device comprising:

a vector decoder that obtains a plurality of values corresponding to an input vector quantization index as decoded values corresponding to a plurality of sample positions; and a coefficient multiplier that outputs, with the use of a group of predetermined coefficients corresponding to the plurality of sample positions and indicated by input index information, the values obtained by multiplying the decoded values and the coefficients, corresponding to the sample positions, wherein the group of coefficients is formed of coefficients disposed on a straight line in a plane having values corresponding to frequency or time corresponding to the sample positions with which the coefficients are associated on a first axis thereof and the values of the coefficients on a second axis thereof; and the coefficients of each of the plurality of groups of coefficients are disposed in the plane on a straight line having a different gradient from straight lines for the other groups.

12. A decoding device comprising:

a vector decoder that obtains a plurality of values corresponding to an input vector quantization index as decoded values corresponding to a plurality of sample positions; and a coefficient multiplier that outputs, with the use of a group of predetermined coefficients corresponding to the plurality of sample positions and indicated by input index information, the values obtained by multiplying the decoded values and the coefficients, corresponding to the sample positions, wherein the group of coefficients is formed of coefficients distributed lopsidedly on a straight line or a specific curve in a plane having values of frequency or time corresponding to the sample positions with which the coefficients are associated on a first axis thereof and the values of the coefficients on a second axis thereof; and the coefficients of the plurality of groups of coefficients are disposed lopsidedly in the plane on straight lines that are not parallel to the first axis or specific curves.

\* \* \* \* \*